(12) United States Patent
Lechner et al.

(10) Patent No.: US 7,977,146 B2
(45) Date of Patent: Jul. 12, 2011

(54) METHOD FOR MANUFACTURING A PHOTOVOLTAIC MODULE

(75) Inventors: Peter Lechner, Vaterstetten (DE); Walter Psyk, Munich (DE); Hermann Maurus, Haar (DE)

(73) Assignee: Schott Solar AG, Alzenau (DE)

( * ) Notice: Subject to any disclaimer, the term of this patent is extended or adjusted under 35 U.S.C. 154(b) by 60 days.

(21) Appl. No.: 12/462,491

(22) Filed: Aug. 4, 2009

(65) Prior Publication Data

US 2010/0035374 A1     Feb. 11, 2010

(30) Foreign Application Priority Data

Aug. 7, 2008 (DE) .......................... 10 2008 036 853

(51) Int. Cl.
*H01L 21/00* (2006.01)

(52) U.S. Cl. ........ 438/80; 438/57; 438/82; 257/E21.025

(58) Field of Classification Search .................... 438/57, 438/80, 82; 257/E21.025
See application file for complete search history.

(56) References Cited

U.S. PATENT DOCUMENTS

2003/0098046 A1   5/2003   Suzuki et al.

2004/0118444 A1 *  6/2004   Duggal et al. ................. 136/244
2009/0162968 A1    6/2009   Lechner et al.

FOREIGN PATENT DOCUMENTS

DE    10 2007 062 620 A1   7/2009
EP         0 193 820        9/1986

\* cited by examiner

*Primary Examiner* — Alexander G Ghyka
*Assistant Examiner* — Seahvosh J Nikmanesh
(74) *Attorney, Agent, or Firm* — Miller, Canfield, Paddock and Stone; Mark L. Maki

(57) ABSTRACT

For the manufacture of a photovoltaic module (1), there are attached to a transparent substrate (2) a transparent front electrode layer (3), a semiconductor layer (4) and a rear electrode layer (5) which, for forming cells ($C_1, C_2, \ldots, C_n, C_{n+1}$) connected in series, are structured by dividing lines (6, 7, 8). A water-soluble detachment mass (12) is applied using an inkjet printer (15) to the regions of the semiconductor layer (4) at which the dividing lines (8) are to be formed in the rear electrode layer (5), whereon the rear electrode layer (5) is attached. The detachment mass (12), with the regions attached thereto of the rear electrode layer (5), is removed using a water jet (13) while forming the dividing lines (8) in the rear electrode layer (5).

4 Claims, 2 Drawing Sheets

Figure 3:
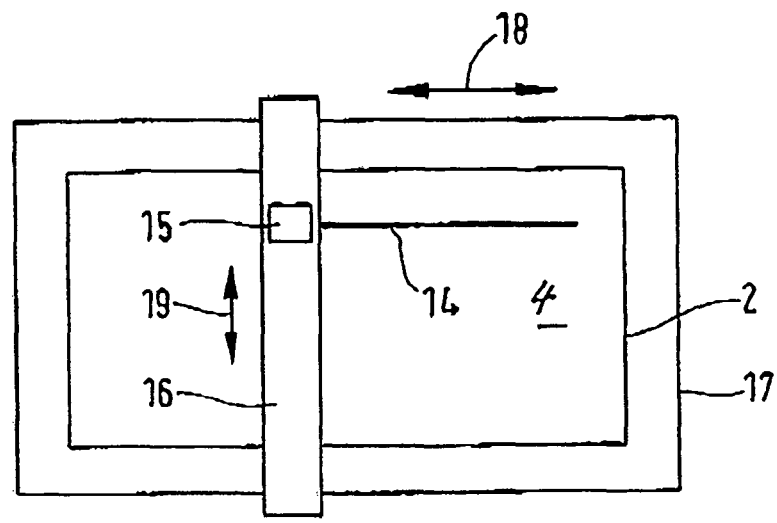

FIG. 1
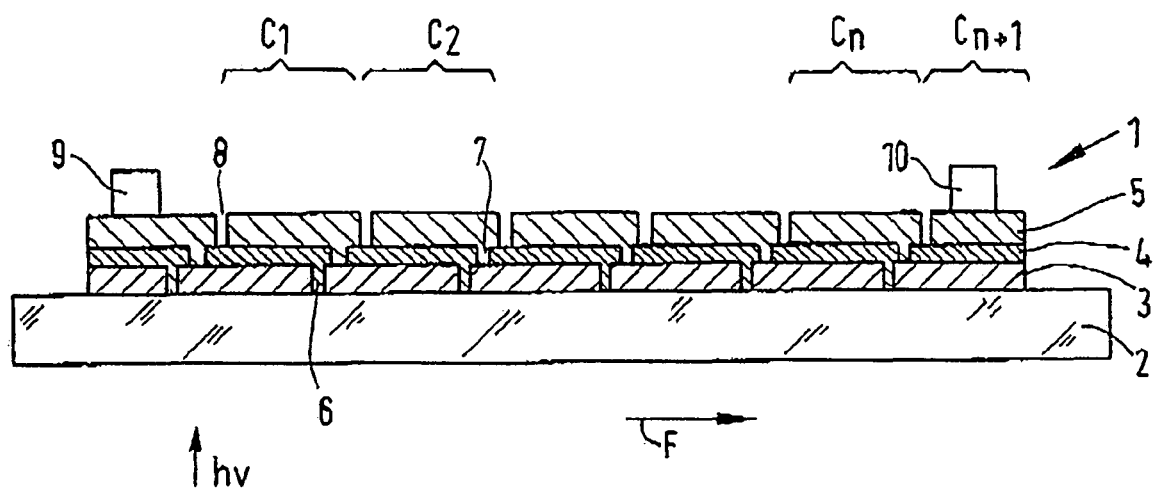
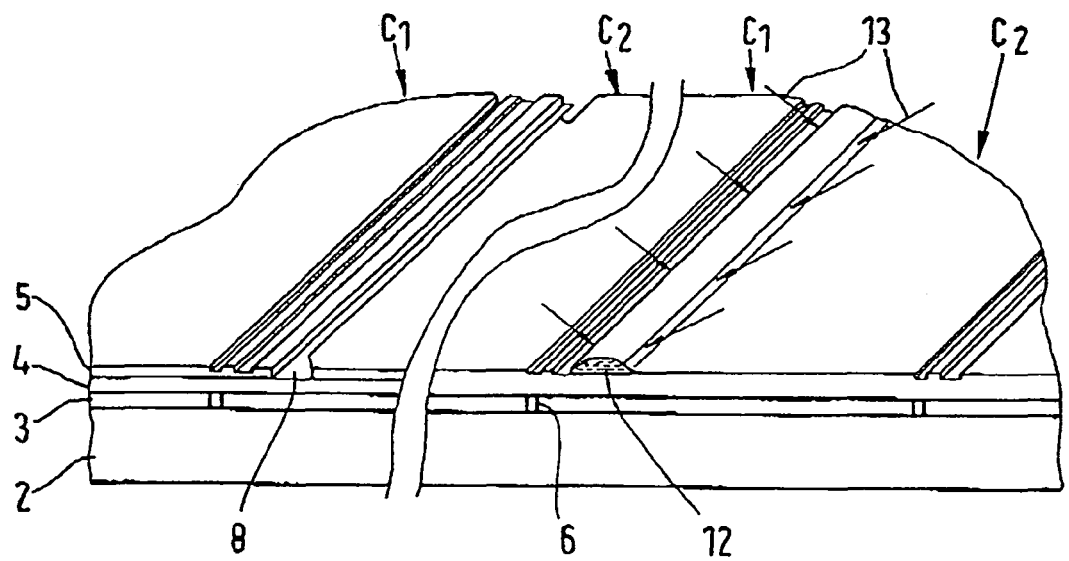
FIG. 2b    FIG. 2a

METHOD FOR MANUFACTURING A PHOTOVOLTAIC MODULE

The invention relates to a method for manufacturing a photovoltaic module according to the preamble of patent claim 1.

In the manufacture of a photovoltaic module, three functional layers, namely a transparent front electrode layer, a semiconductor thin layer and a rear electrode layer, are deposited over a large area on a transparent, electrically insulating substrate, for example a pane of glass.

In order to form cells connected in series from these monolithic layers, the layers are structured by dividing lines, for example using a laser, a mechanical method or chemically.

Laser technology is conventionally used for structuring the front electrode layer which consists for example of a transparent, electrically conductive metal oxide (TCO), for example doped tin oxide. The laser used is typically a neodymium-doped yttrium-aluminium garnet (Nd:YAG) or a neodymium-doped yttrium-vanadate (Nd:YVO$_4$) solid-state laser which emits radiation having a wavelength of 1,064 nm.

The semiconductor layer, for example a silicon thin layer, is also structured typically using laser light. In this case, use is made of a frequency-doubled (Nd:YAG) or a (Nd:YVO$_4$) solid-state laser which emits laser light having a wavelength of 532 nm.

Both mechanical methods and laser methods are used for structuring the rear electrode layer which consists of metal or an electrically conductive metal oxide.

In the structuring of the rear electrode layer using laser technology, a (Nd:YAG) or a (Nd:YVO$_4$) solid-state laser is typically used and the laser beam is focused from the glass side into the layers. The mechanical methods use mask technology in which for example metal wires mask the surface of the semiconductor during coating with the rear electrode layer or adhesive paste is linearly applied to the semiconductor layer in the regions at which the rear electrode layer is to be provided with dividing lines, so that the semiconductor layer is masked in these regions during subsequent coating with the rear electrode layer. In the following "lift-off" process, the linear masking medium, with the rear electrode layer positioned thereabove, is mechanically removed. Thus, the rear electrode layer is separated into individual strips.

Whereas, during the formation of the dividing lines in the rear electrode layer using laser technology, the semiconductor layer positioned therebelow is affected to a greater or lesser extent, the semiconductor layer remains unimpaired on use of a paste and the "lift-off" process.

A paste is applied as the masking medium using a metering tool which is used to apply the paste to the semiconductor layer through a hollow needle or similar nozzle. In synchronisation with the movement of the tool, a metering medium, which is generally controlled by compressed air, is used to supply the required amount of paste to the metering tool from a storage container.

The paste is applied to the semiconductor layer in parallel, equidistant lines. For this purpose, once a line has been applied, the application of the paste is interrupted until the injection mould has been positioned in such a way as to allow the next line to be applied. The time-interrupted application of paste can cause the nozzle to become clogged with remnants of paste.

In addition, the hollow needle can become blocked as a result of the paste drying out if, after the application of all the lines to the semiconductor layer of a module, the module is discharged in order to apply the paste to the semiconductor layer of a new module.

The application of the paste can also be interrupted for one line, for example in the event of fluctuations of the supply media, for example the compressed air. Thus, a region of the semiconductor layer is not masked within a line. In the case of interrupted lines of paste, after the coating with the rear electrode layer and after the "lift-off" process, the rear electrode layer of adjacent cells of the photovoltaic module is electrically connected and the cells are thus electrically short-circuited.

This leads to substantial waste. In addition, error-free functioning of the application of paste requires complex process control and intensive maintenance of the paste application tools to be carried out.

Owing to their tough consistency, the paste forms lines having a thickness of about 500 nm on the semiconductor layer. The lines must be dried, prior to the coating with the rear electrode layer, for example by sputtering. However, the drying of the thick lines is very time-consuming. If the paste is not dried sufficiently, there is the risk that it will come apart during the coating with the rear contact, for example by glow discharge deposition (PE PVD) under vacuum, thus producing after the "lift-off" process a photovoltaic module having dividing lines of undefined width in the rear electrode layer.

The object of the invention is therefore to manufacture at lower cost high-quality photovoltaic modules without wastage problems.

According to the invention, this is achieved by the method characterized in claim 1. Preferred embodiments of the method according to the invention are represented in the sub-claims.

In the method according to the invention, the transparent, electrically non-conductive substrate, for example a pane of glass or plastic material plate, is first coated with the transparent front electrode layer. The coating with the transparent front electrode layer can be carried out for example by PE PVD. The front electrode layer consists preferably of TCO (transparent conductive oxide), for example doped, in particular fluorine-doped, tin oxide, doped, in particular aluminium-doped, zinc oxide or the like.

Subsequently, for structuring the front electrode layer, the dividing lines are generated for example using a laser, preferably using a (Nd:YAG) or a (Nd:YVO$_4$) solid-state laser having a wavelength of 1,064 nm.

The structured front electrode layer is then coated with the semiconductor layer, for example by PECVD. The semiconductor layer may consist of silicon, for example amorphous, nanocrystalline, microcrystalline or polycrystalline silicon, but also of other semiconductors, for example copper-indium or copper-indium-gallium sulphide and/or selenide or of cadmium telluride. The dividing lines in the front electrode layer are filled with the semiconductor during the coating with the semiconductor layer.

For structuring the semiconductor thin layer, the dividing lines in the semiconductor layer are generated for example using a laser, preferably a (Nd:YAG) or (Nd:YVO$_4$) solid-state laser having a wavelength of 532 nm.

Subsequently, the regions of the semiconductor layer at which the dividing lines are to be formed in the rear electrode layer are provided with a detachment mass.

According to the invention, for forming the detachment mass, use is made of a dispersion or solution of the detachment mass that is applied to the semiconductor layer using an inkjet printer and subsequently dried.

The detachment mass may consist for example of a binder which can contain pigments or dyes. Preferably, the binder used is in the form of resins, in particular water-soluble resins, for example plastics material resins containing carboxyl, hydroxyl or similar salt-forming groups, for example carboxyl group-containing urea and/or aldehyde resins. The solvent or dispersing agent, in which the binder is dissolved or dispersed, may for example be an alcohol or another readily volatile solvent which is preferably miscible with water. For example, for forming the detachment mass, use may also be made of water-soluble inks which are commercially available for the imprinting of steel using inkjet printers.

The essential property of the solution or dispersion which is used in accordance with the invention and applied using the inkjet printer, in order to form the detachment mass, is to dry rapidly and to form a thin film which, after drying, is not to be thicker than the rear electrode layer, i.e. preferably has a layer thickness of from 0.1 to 5 µm, in particular 0.3 to 3 µm.

As the rear electrode layer is applied generally under vacuum, for example by sputtering, the detachment mass should be vacuum-resistant, and resist high temperatures, when dry. Furthermore, the detachment mass must cling securely to the semiconductor layer after the coating with the rear electrode layer, the subsequent ventilation to atmospheric pressure and cooling to room temperature. Also, the detachment mass may not form any cracks after drying, as cracks would lead, when they are filled during coating with the rear electrode layer, to a short circuit between adjacent cells of the photovoltaic module.

The inkjet printer used is preferably a continuous inkjet or CIJ printer or a drop-on-demand or DOD printer. A continuous inkjet printer or CIJ printer is preferred. In a CIJ printer, the detachment mass solution or dispersion issues from the nozzle even in the pause when, after the application of all the lines to the semiconductor layer, a module is discharged in order to provide the semiconductor layer of a new module with the detachment mass lines. In this case, the detachment mass solution or dispersion issuing from the nozzle in the pause is collected in a vessel and returned in the circuit to the storage container of the inkjet printer. This prevents the nozzle of the inkjet printer from becoming clogged during charging and discharging of the modules. That is to say, in a continuous inkjet printer, the detachment mass solution or dispersion is constantly moving in the nozzle, so that it cannot clump together or dry out.

In the preferably continuous inkjet printer, the jet issues from the nozzle through a piezoelectric converter in individual drops which can be electrostatically charged up using charging electrodes and laterally deflected using deflection electrodes, i.e. either for forming lines onto the semiconductor layer of the module in question or into the collection container for recycling the detachment mass solution or dispersion.

The detachment mass, which is applied in droplets using the inkjet printer, has, depending on the relative speed between the inkjet printer and the substrate provided with the front electrode and semiconductor layer and also on the size of the drops given off by the inkjet printer, straight edges or edges which are curved in an arcuate manner as a result of joining-together of discrete drops. In this case, the width of the applied detachment mass line should not fluctuate, after drying, by more than 20 to 30%. The width of the detachment mass lines may be for example 50 to 500 µm, in particular 100 to 300 µm.

During application of the detachment mass, the inkjet printer and the substrate provided with the front electrode and semiconductor layer are moved relative to each other.

For this purpose, the substrate can be arranged for example on a carriage which is movable in one direction or two directions perpendicular to each other and/or the inkjet printer can be provided on a carrier which is movable in a direction perpendicular to the direction of movement of the carriage. The substrate can also be arranged on a table, the carrier being movable relative to the table in two directions perpendicular to each other or, if the inkjet printer is movable along the carrier, being movable only in one direction.

Once the semiconductor layer of the module has been provided with the detachment mass lines, the rear electrode layer is applied.

The rear electrode layer is formed preferably by a metal layer or an electrically conductive metal oxide. The metal layer may consist for example of aluminium, copper or silver. The metal oxide may be a transparent metal oxide, for example tin oxide or zinc oxide.

It is also possible for there to be attached between the metal layer and the semiconductor layer an intermediate layer which consists for example of a doped TCO, such as indium oxide or aluminium-doped zinc oxide, and for example prevents metal atoms from diffusing out of the metal layer into the semiconductor layer of the module.

The rear electrode layer is attached preferably by sputtering, but can also be applied by other coating methods, for example by vapour deposition. In this case, the dividing lines or trenches in the semiconductor layer are filled.

After the coating of the semiconductor layer, which is provided with the detachment mass lines, with the rear electrode layer, the detachment mass, with the rear electrode layer attached thereto, is mechanically removed ("lift-off" process).

For this purpose, a water jet is preferably used to remove the preferably water-soluble detachment mass. The water jet is used to dissolve the detachment mass without residue and the rear electrode layer positioned thereon becomes detached in this region. The pressure of the water jet may be for example 0.5 to 2 bar.

In order to ensure residue-free detachment of the rear electrode layer attached to the detachment mass during the "lift-off" process, the semiconductor layer must be thoroughly wetted. As a result of the wetting of the semiconductor layer by the detachment mass solution or dispersion, an error-free image, i.e. no constricting or running of the solution or dispersion, is at the same time obtained, thus forming a dividing line at which any electric short-circuiting of adjacent cells of the module is prevented by a bridge in the rear electrode layer.

The use of (neutral) water for the "lift-off" process ensures that the semiconductor layer is not impaired in the process.

Thus, the rear electrode layer is also provided with the required dividing lines and the structuring for forming cells connected in series of the photovoltaic module is concluded.

The dividing lines in the rear electrode layer can have a width of for example from 50 to 300 µm in order to attain the electrical separation, which is necessary for the integrated connection in series, of the cells of the photovoltaic modules. The width of the dividing lines in the front electrode layer and in the semiconductor layer is typically 30 to 50 µm.

The invention provides high process safety and stability. Nor are any complex maintenance and control operations necessary.

Figure 4:
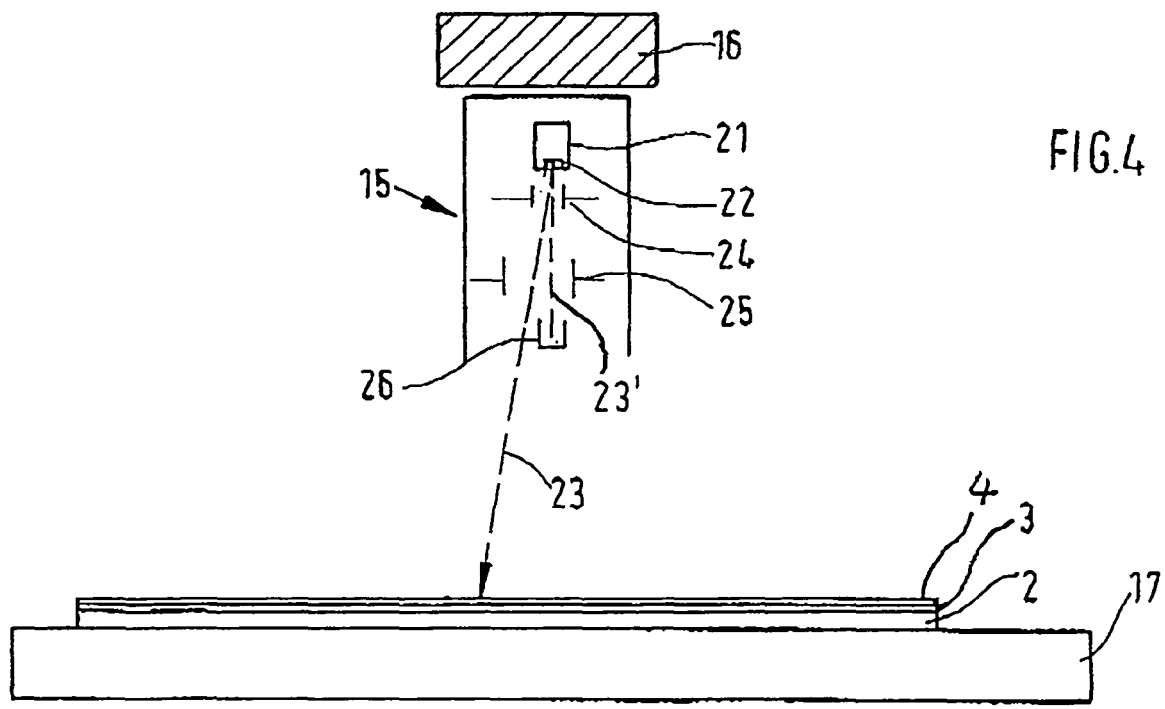

The invention will be described hereinafter in greater detail and by way of example with reference to the drawings, in which:

FIG. 1 is a schematic cross section through a photovoltaic module;

FIGS. 2a and 2b are each schematic perspective partial views of two adjacent cells after the coating of the module with the rear electrode layer or after the "lift-off" process; and FIGS. 3 and 4 are a schematic side view and schematic size-reduced plan view respectively of a device for applying the detachment mass to the substrate provided with the front electrode layer and the semiconductor layer.

According to FIG. 1, the photovoltaic thin-layer module 1 has a transparent substrate 2, for example a pane of glass which is arranged on the light incident side hv of the module. On the substrate 2, three functional layers, namely a transparent front electrode layer 3, a semiconductor thin layer 4 and a rear electrode layer 5, are deposited one on another. The rear electrode layer 5 can be provided with a protective layer (not shown) made for example of plastics material.

The module 1 consists of individual strip-like cells $C_1$, $C_2, \ldots C_n, C_{n+1}$ which are connected in series. For this purpose, the front electrode layer 3 is interrupted by dividing lines 6, the semiconductor layer 4 is interrupted by dividing lines 7 and the rear electrode layer 5 is interrupted by dividing lines 8 extending perpendicular to the current flow direction F of the module 1.

The optimum width of the strip-like cells $C_1, C_2, \ldots C_n, C_{n+1}$ is determined by the surface resistance of the front electrode layer 3 and the rear electrode layer 5 and also the impedance of the cell during illumination. Typically, a power-optimised module yields, depending on the thin-layer technology, cell widths of from 4 to 10 mm in thin-layer single cells, i.e. cells having only one p-n junction for example with a semiconductor layer made of silicon, whereas the cell width in silicon thin-layer stack cells, i.e. cells having a plurality of p-n junctions is usually 7 to 20 mm.

The rear electrode layer 5 of a cell $C_1, \ldots C_n$ thus contacts, through the dividing lines 7 in the semiconductor layer 4, the front electrode layer 3 of the adjacent cell $C_2, \ldots C_{n+1}$. The current generated by the photovoltaic module is picked off using the contacts 9, 10 at both sides of the module, the contact 9 being the positive pole and the contact 10 the negative pole.

The dividing lines 6 in the front electrode layer 3, which is formed for example from tin oxide, may be formed using the focused laser beam of a (Nd:YAG) or a (Nd:YVO$_4$) solid-state laser having a wavelength of 1,064 nm, and the dividing lines 7 in the silicon semiconductor layer 4 may be formed using a (Nd:YAG) or a (Nd:YVO$_4$) solid-state laser having a wavelength of 532 nm.

For forming the dividing lines 8 in the rear electrode layer 5, which consists for example of a metal, there has been linearly applied, according to FIG. 2a, to the semiconductor layer 4 a water-soluble detachment mass 12 which has then been coated, for example by sputtering, with the rear electrode layer 5.

As a result of the water jet illustrated by the arrows 13, the rear electrode layer 5 is damaged, for example mechanically, on the detachment mass 12, the water-soluble detachment mass 12 being dissolved at the damaged points of the rear electrode layer 5 and thus the rear electrode layer 5 being detached and removed at the points deposited on the detachment mass 12 while forming the dividing lines 8, as illustrated in FIG. 2b and FIG. 1.

The detachment mass 12 is applied, using an inkjet printer 15 according to FIGS. 3 and 4, to the substrate 2 which is provided with the front electrode layer 3 and the semiconductor layer 4.

For this purpose, according to FIG. 3, the inkjet printer 15 may be arranged on a carrier 16 which is movable along the table 17 in the direction of the double-headed arrow 18. In addition, the inkjet printer 15 can be moved along the carrier 16 and thus transversely to the table 17 in the direction of the double-headed arrow 19.

It is thus possible, by moving the carrier 16 toward the left, as indicated by the arrow 18 in FIG. 3, when the inkjet printer 15 is in a specific position relative to the carrier 16, to apply, using the inkjet printer 15, the detachment mass 12 to the semiconductor layer 4 in lines 14 corresponding to the dividing lines 8.

Subsequently, the rear electrode layer 5 is applied and afterwards the detachment mass 12, with the rear electrode layer 5 positioned thereabove, is removed by spraying-down of the module 1 with the water jet 13 so as to form the dividing lines 8, as described hereinbefore and illustrated in FIGS. 2a and 2b.

According to FIG. 4, the inkjet printer 15 has after the nozzle 22 a piezoelectric converter 21 which electrostatically charges up, using a charging electrode 24, the detachment mass solution or dispersion, which is supplied from a storage container (not shown), as drops which are subsequently deflected using a deflection electrode 25 laterally onto the semiconductor layer 4, as illustrated by the jet 23.

The inkjet printer 15 is embodied as a continuous printer, i.e. the drops are formed even in the pauses, for example for the charging and discharging of the substrates. For this purpose, the drops can be supplied, using the deflection electrode 25, to a collection container 26 on the print head of the inkjet printer 15, as illustrated by the jet 23', from where they are supplied to the storage container (not shown) in a circuit.

The invention claimed is:

1. Method for manufacturing a photovoltaic module, in which there are attached to a transparent substrate a transparent front electrode layer, a semiconductor layer and a rear electrode layer which, for forming cells connected in series, are structured by dividing lines, a detachment mass being applied in lines corresponding to the dividing lines after the attachment of the semiconductor layer to the regions of the semiconductor layer at which the dividing lines are to be formed in the rear electrode layer, whereon the rear electrode layer is attached and the detachment mass, with the regions attached thereto of the rear electrode layer, is removed for forming the dividing lines in the rear electrode layer, characterised in that, for forming the detachment mass, there is applied to the semiconductor layer using an inkjet printer a dispersion or solution of the detachment mass that is subsequently dried, the inkjet printer used being a continuous inkjet printer, so that the dispersion or solution of the detachment mass issues from the inkjet printer even in the pause when, after the application of all the lines to the semiconductor layer, a module is discharged in order to provide the semiconductor layer of a new module with the detachment mass lines.

2. Method according to claim 1, characterised in that a water-soluble detachment means is applied using the inkjet printer.

3. Method according to claim 2, characterised in that a water jet is used for mechanically removing the detachment mass and the regions attached thereto of the rear electrode layer.

4. Method according to claim 1, characterised in that the detachment mass has after drying a layer thickness of from 0.1 to 5 μm.

* * * * *